United States Patent [19]
Winter et al.

[11] Patent Number: 5,781,760
[45] Date of Patent: *Jul. 14, 1998

[54] METHODS OF SIMULATING AN ELECTRONIC CIRCUIT DESIGN AND FORMING AN INTEGRATED CIRCUIT

[75] Inventors: Marlan L. Winter; Kenneth P. Tumin; Steven P. Lindquist, all of Austin, Tex.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 558,451

[22] Filed: Nov. 16, 1995

[51] Int. Cl.⁶ .................................................. G06F 9/30
[52] U.S. Cl. .................. 395/500; 395/702; 395/568; 395/384; 395/551; 364/578
[58] Field of Search ........................ 395/500, 702, 395/703, 183.01, 183.13, 183.11, 861, 180, 421.05, 568, 704, 384, 551; 364/488, 489, 578, 570; 371/24

[56] References Cited

U.S. PATENT DOCUMENTS

| | | | |
|---|---|---|---|
| 4,677,587 | 6/1987 | Zemany, Jr. | 364/900 |
| 4,744,084 | 5/1988 | Beck et al. | 371/23 |
| 5,111,413 | 5/1992 | Lazansky et al. | 364/578 |
| 5,425,036 | 6/1995 | Liu et al. | 371/23 |
| 5,450,586 | 9/1995 | Kuzara et al. | 395/700 |
| 5,485,600 | 1/1996 | Joseph et al. | 395/500 |
| 5,553,002 | 9/1996 | Dangelo et al. | 364/489 |

FOREIGN PATENT DOCUMENTS

1034043   8/1983   U.S.S.R. .......... G06F 15/04

OTHER PUBLICATIONS

Lai, et al.:"Arden—Architecture Development Environment;" IEEE Tencon Proceedings '93; pp. 5–9, (1993).

Goatley; "Renumbering MACRO Local Labels;" VAX Professional; 3 pages, (1990).

Mapou; "Tachistoscopic timing on the TRS–80;" Behavior Research Methods & Instrumentation; vol. 14(6), pp. 534–538, (1982).

Hayes, et al.; "An Assembler for Experimental Systems Use;" 5th Australian Computer Conference; pp. 298–305, (1972).

Primary Examiner—Kevin J. Teska
Assistant Examiner—Thai Phan
Attorney, Agent, or Firm—George R. Meyer

[57] ABSTRACT

During an electronic circuit simulation, an input file is generated that has source code and stimulus sections. Each of the source code and stimulus sections includes linking portions that each link a portion of the source code to a portion of the stimulus sections. The input file is processed to generate object code and a stimulus file that includes linking portions. The linking portions of the stimulus file allow events to occur that are synchronized with the object code during the running of a simulation program. The linking between the stimulus file and the object code is synchronized because the stimulus file is generated from the input file that has the linking portions. The linking remains synchronized even if the input file is modified. After a simulation, masks (30, 40, 50, 60, 70) can be generated and used to form an integrated circuit (20).

29 Claims, 4 Drawing Sheets

METHODS OF SIMULATING AN ELECTRONIC CIRCUIT DESIGN AND FORMING AN INTEGRATED CIRCUIT

RELATED APPLICATION

This is related to U.S. patent application Ser. No. 08/558,518 filed on even date and assigned to the current assignee hereof.

FIELD OF THE INVENTION

The present invention relates to electronic circuit designs and integrated circuits, and in particular, to simulations of the electronic circuit designs using an input file having assembly or compiler portions and stimulus portions and to the formation of integrated circuits based on those simulations.

BACKGROUND OF THE INVENTION

Electronic circuit designs are typically simulated by a computer to identify problem areas of the design before masks are generated or semiconductor substrates are processed. The simulation tests how the electronic design operates even if random events occur. An input file and a stimulus file are typically generated by one or more persons. The input file can have assembly code that can be processed using an assembler to generate object code. The stimulus file can represent external events including random events.

A simulation program is run and uses the object code, the stimulus file, and a model file that includes a hardware representation of the electronic circuit being simulated. The simulation program generates a results file that is reviewed after the simulation to confirm the design is correct or to verify modifications to the design.

The method described above has problems. The method is error prone and may require several iterations before the object code and the stimulus file are synchronized. A listing file is typically generated when the assembly code is compiled. The listing file includes the assembly and object code and is used to link the stimulus file to the object code. Typically, the linking is done by a person. If the object code and the stimulus file are not synchronized, the input or stimulus file needs to be changed. Modifications to the input or stimulus files usually require the object code and stimulus file to be re-synchronized, another manual operation.

A need exists to synchronize object code and a stimulus file during an electronic design simulation that is not error prone or require iterations. Another need exists to synchronize the object code to the stimulus file even if the input file is modified.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

During an electronic circuit simulation, an input file is generated that has source code and stimulus sections. Each of the source code and stimulus sections includes linking portions that each link a portion of the source code to a portion of the stimulus sections. The input file is processed to generate object code and a stimulus file that includes linking portions. The linking portions of the stimulus file allow events to occur that are synchronized with the object code during the running of a simulation program. The linking between the stimulus file and the object code is synchronized because the stimulus file is generated from the input file that has the linking portions. The linking remains synchronized even if the input file is modified. After a simulation, masks can be generated and used to form an integrated circuit. The methods of the present invention allow a working electronic circuit to be formed faster. The present invention is better understood with the embodiments described below.

Figure 1:
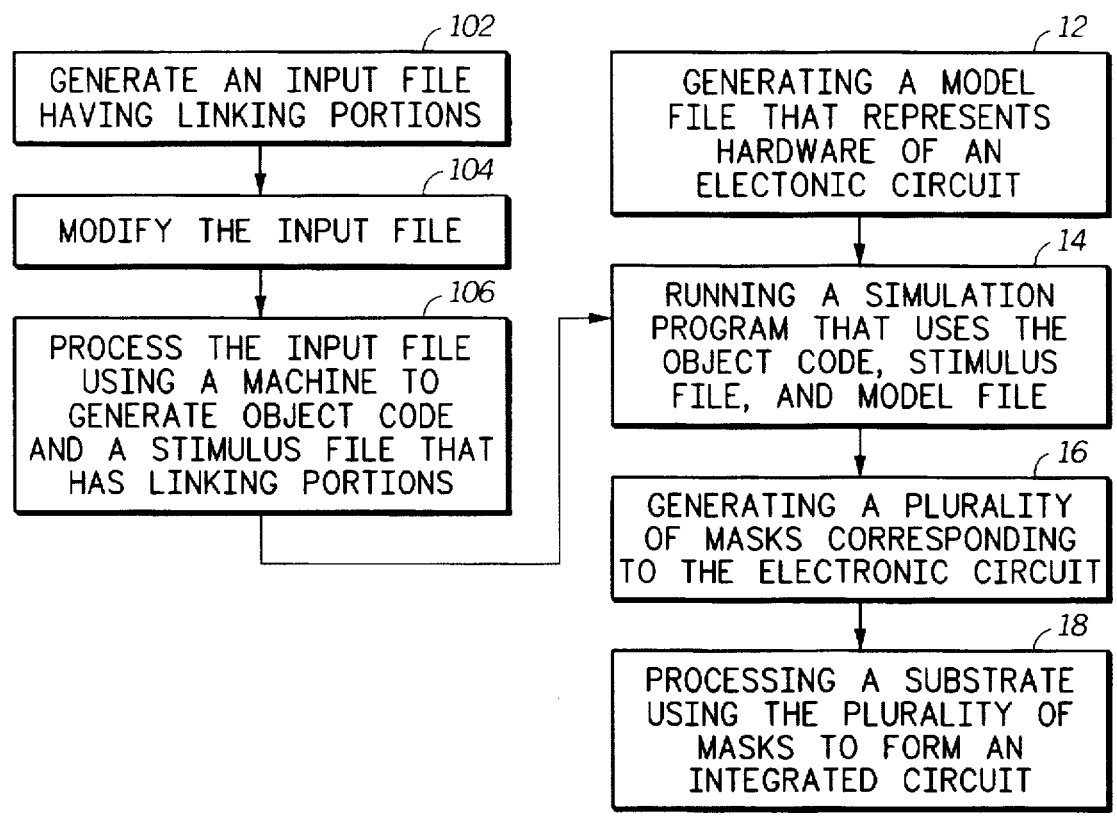
FIG. 1 includes a process flow diagram of an embodiment of the present invention.

FIG. 1 includes a process flow diagram of an embodiment of the present invention. In step 102, an input file is generated that has source code and stimulus sections. As used in this specification, source code is a file, portion of a file, or equivalent to be used by a computer or data processor that is essentially in a human-readable form. The source code can be for an assembler, compiler, or the like. Each of the source code and stimulus sections has linking portions. Table I includes a listing of a portion of the input file. In this embodiment, the lines that begin with an ampersand are the stimulus portions and all other lines that are not preceded by an ampersand are source code.

TABLE I

```
&initial begin
PORTH    EQU $1024
         ORG $FFFE
RESET    FDB $6000
         ORG $6000
         LDX #$FFFF
         LDY #$FFFF
         STAA $0011
         LINK code_pc
         LDAA PORTH
&
&wait('pipe_adr_bus === code_pc)porth = 8'hff
&
&end
         STAA $60
         BRAA
           •
           •
           •
```

In Table I, "LINK code_pc" is a linking portion of the source code and "&wait('pipe_adr_bus . . . " is a linking portion of the stimulus section of the input file. The linking portion of the source code is associated with the linking portion of the stimulus section. These linking portions form a source code-stimulus section linking pair. In this example, linking portions are related to an instruction in the source code that loads accumulator "A" with the value on port "H" ("LDAA PORTH").

After the file has been generated, the input file may be modified (step 104). The linking between the source code and the stimulus section can stay synchronized even if the input file is modified. For example, additional source code lines, such as instructions, etc., in the input file can be added or deleted (except for "LINK code_pc" or "LDAA PORTH") without affecting the synchronization between the source code and stimulus section. The input file can include several source code-stimulus section linking pairs similar to the one described above. The input file can be modified before the last source code-stimulus section linking pair (closest to the end of the input file) without affecting the synchronization of this last linking pair.

Although not required, the linking portions within the source code should be immediately adjacent to source code lines to which the linking is related. Referring to Table I, "LINK code_pc" is a linking portion of the source code and is immediately adjacent to "LDAA PORTH" which is the line in the source code to which the linking is related. The linking portion of the stimulus section is also related to "LDAA PORTH." As will be explained later, as a linking portion of source code is placed further from its related source code line, the greater likelihood there is that the object code and stimulus file are not synchronized.

The input file is processed using a machine to generate object code and a stimulus file that has linking portions (step 106). The machine is an assembler, a compiler, or the like. A portion of the stimulus file that corresponds to the input file appears in Table II.

TABLE II initial begin
code_pc=24586; ///(600a hex) Current PC value for LDAA PORTH
wait('pipe_adr_bus === code_pc)porth=8'hff;
end
.
.
.

In Table II, the lines "code_pc=24586 . . . " and "wait ('pipe_adr_bus . . . " of the stimulus file form a linking portion of the stimulus file that corresponds to "LINK code-pc" of the source code and wait('pipe_adr_bus . . . " of the stimulus section. All of these linking portions are related to "LDAA PORTH."

Figure 2:
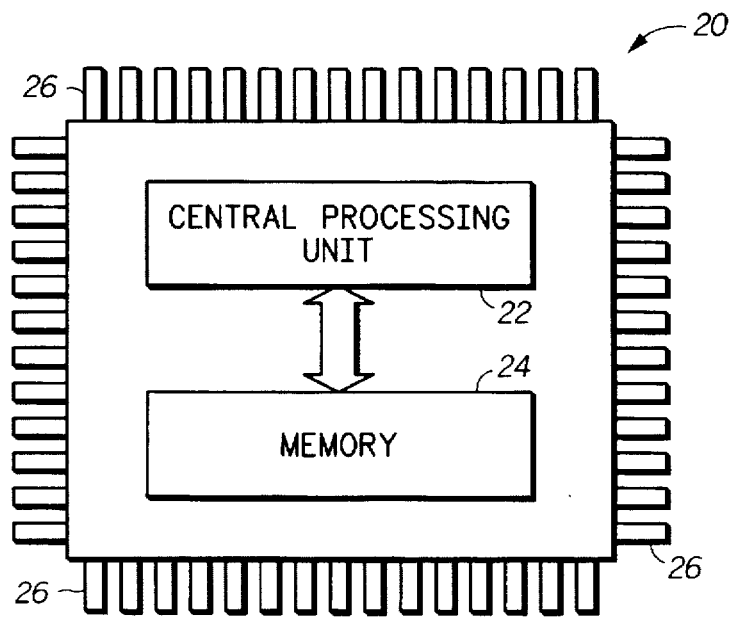
FIG. 2 includes a schematic view of an integrated circuit.

A model file is generated that represents the hardware of the electronic circuit being designed (step 12), such as integrated circuit 20 shown in FIG. 2. The integrated circuit 20 includes a central processing unit 22 that is bi-directionally coupled to a memory 24. The integrated circuit 20 also includes electrodes 26. Other circuitry and modules may be included within the integrated circuit 20 but are not shown in FIG. 2. The integrated circuit 20 can be a microcontroller, microprocessor, a digital signal processor, or the like. Usually, a person generates the model file, however, the model file could be generated by a machine, such as a computer, etc.

A simulation program is run using the object code, stimulus file, and model file (step 14 of FIG. 1). The simulation program is run on a computer, data processor, or the like. The simulation tests the electronic circuit design. During the simulation, the object code is being processed and does not look for the stimulus file, rather, the stimulus file must know when predetermined events are to occur in relation to the object code as it is being executed. Put in other terms, the stimulus file is "slaved" to the object code.

As the simulation program is run, the machine running the program has been instructed by the stimulus file that the program counter will be at 24586 ("code_pc=24586 . . . ") when the object code corresponding to "LDAA PORTH" of the source code is reached. When the value on the pipe address bus reaches 24586, the value of port "H" is set equal to the value "8'hff" because of "wait('pipe_adr_bus . . . " The machine then loads accumulator "A" with the value on port "H" ("LDAA PORTH") that is equal to the value "8'hff." The simulation program continues to completion.

In this embodiment, the linking portions are related to "LDAA PORTH." The object code and stimulus file can remain synchronized even if the input file is modified prior to generating the object code and stimulus file. The input file can be modified before or after the source code-stimulus section pair without affecting the synchronization because the pair move together. Care needs to exercised if lines of source code are added between "LINK code-pc" and "LDAA PORTH." If any lines affecting the value on port "H" are between those two lines, the object code and stimulus files generated from the input file may no longer be synchronized. For example, the line "PORTH EQU $1024" should not lie between "LINK code_pc" and "LDAA PORTH."

The input file and stimulus files can be much longer than the portions shown in Table I and II. The linking portions in this example use a program counter. Alternatively, the linking portions could use a label, expression, or the like.

In one embodiment, steps 106 and 14 can be performed using a SparcStation™ brand computer that has an "AS12" assembler. The computer is made by Sun Microsystems, Incorporated of Mountain View, Calif. Steps 102, 104, and 12 can be performed by a person or by a computer. The simulation program can be Verilog™ brand sold by Cadence Design Systems, Incorporated of San Jose, Calif. While specific equipment and simulation programs have been listed, the invention is not limited to be used only on this equipment or simulation programs.

After performing a simulation, the electronic circuit is then laid out to generate magnetic tapes corresponding to those electronic circuits. The magnetic tapes are used to generate masks (step 16 of FIG. 1), as shown in FIGS. 3–7. In this specific embodiment, these masks are used to form the integrated circuit 20 that includes an electrically programmable read-only memory (EPROM) cell within the memory 24. In this example, the masks are stencil-type masks used with positive resist. If negative resist is used, the masks are mirror images of the ones shown.

Figure 3:
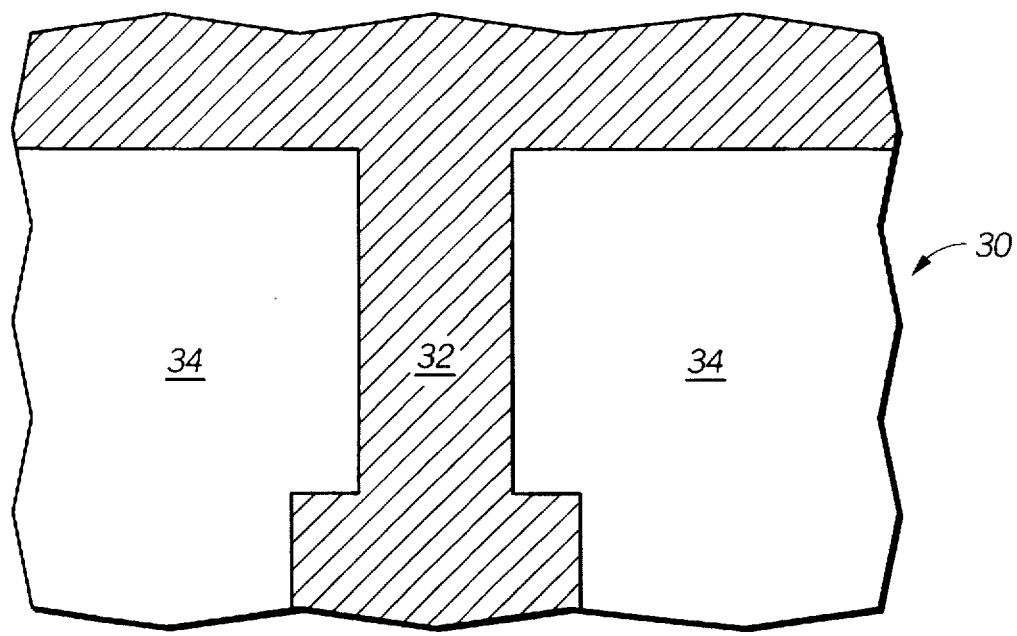
FIGS. 3–7 include plan views of portions of masks for integrated circuit.
Figure 4:
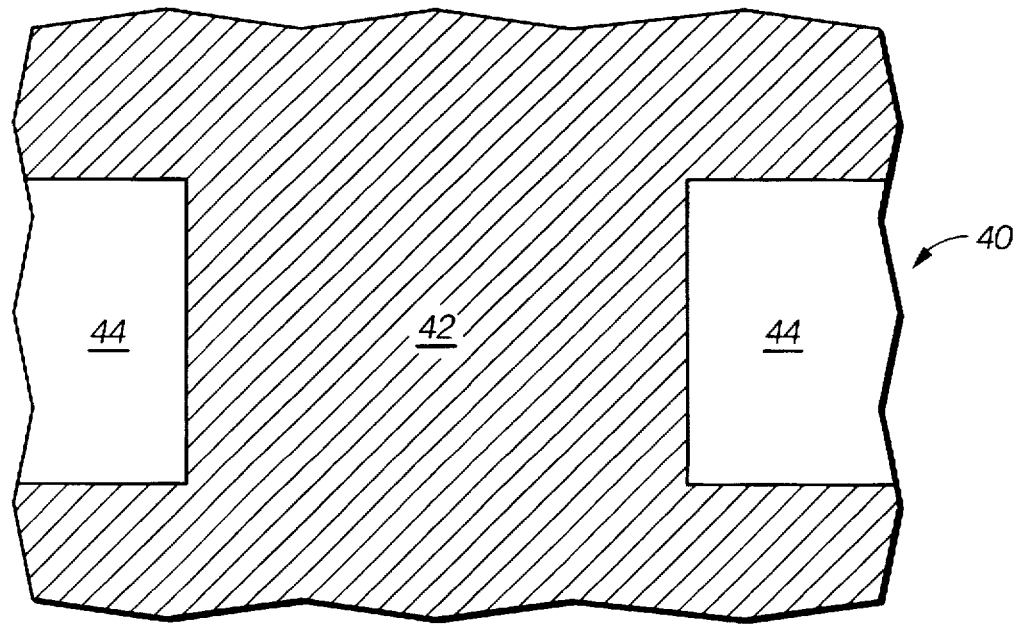

FIG. 3 includes an illustration of a plan view of a portion of a field isolation mask 30. The field isolation mask 30 includes transparent regions 34 and a chrome element 32. In mask 30, the chrome element 32 generally corresponds to locations where the active region is formed. The transparent region 34 generally correspond to where field isolation regions are formed. A transparent region is a region that is transparent to the radiation source used when selectively exposing a resist layer using the mask. A portion of a floating polycrystalline silicon (polysilicon) mask 40 is shown in FIG. 4. Chrome element 42 generally corresponds to a location where floating polysilicon will initially remain after a floating polysilicon etch. Regions 44 are transparent.

Figure 5:
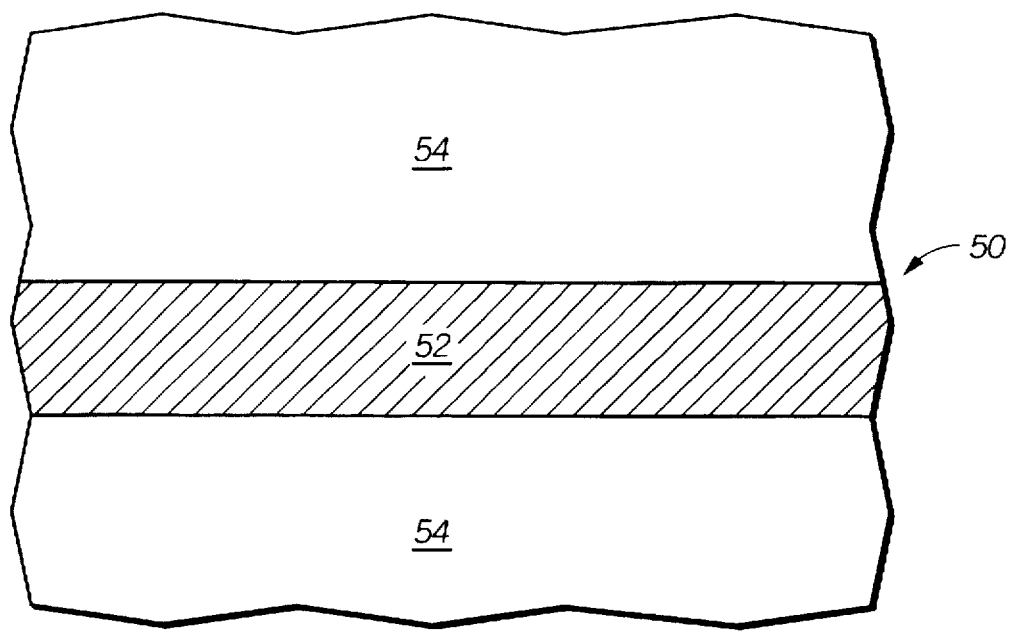
Figure 6:
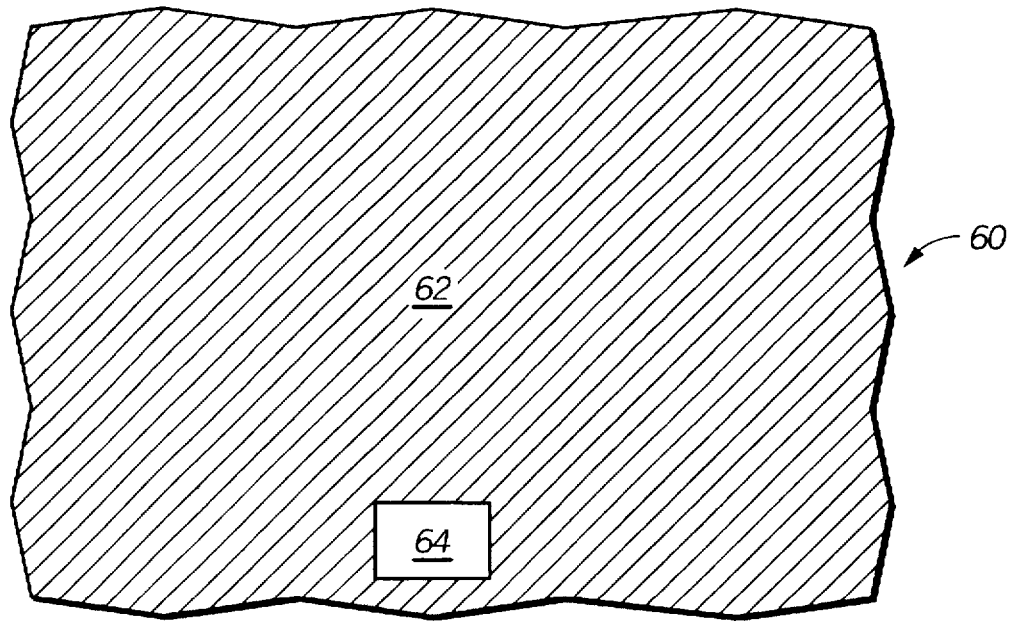
Figure 7:
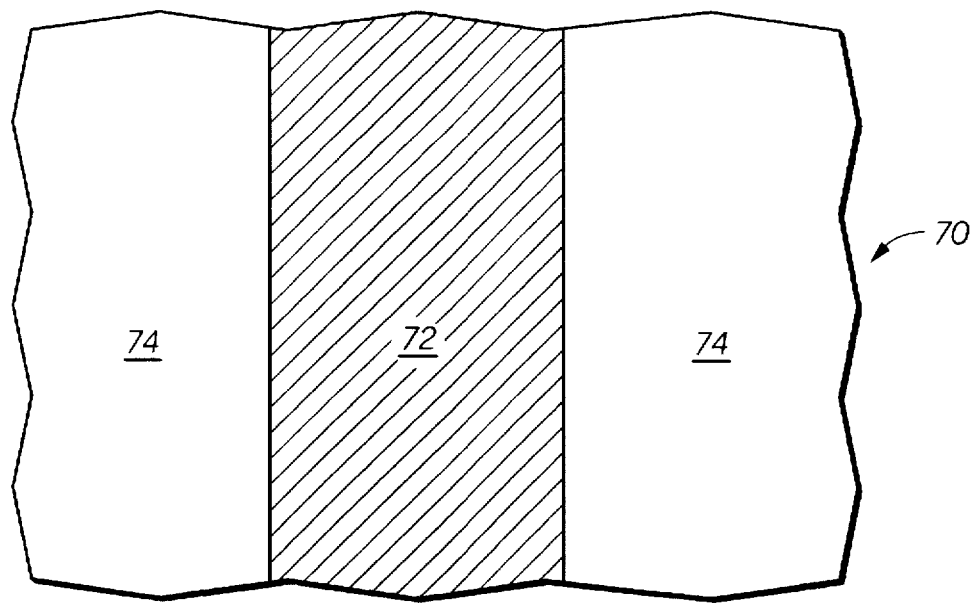

FIG. 5 includes an illustration of a plan view of a portion of control gate polysilicon mask 50. Chrome element 52 generally corresponds to a location of a control gate member, and regions 54 are transparent. After control gate polysilicon mask 50 is used to expose selectively a resist layer, a two-step etch sequence is used remove portions of the floating gate polysilicon layer and control gate polysilicon layer that are not covered by the unexposed portion of the resist layer (self-aligned, stacked gate EPROM). A portion of contact mask 60 is shown in FIG. 6 and includes a chrome element 62 and a transparent portion 64 that generally corresponds to a location where a contact is formed. Metal mask 70 includes a chrome element 72 and transparent regions 74 as shown in FIG. 7. The chrome element generally corresponds to a location where a metal bit line is formed.

Figure 8:
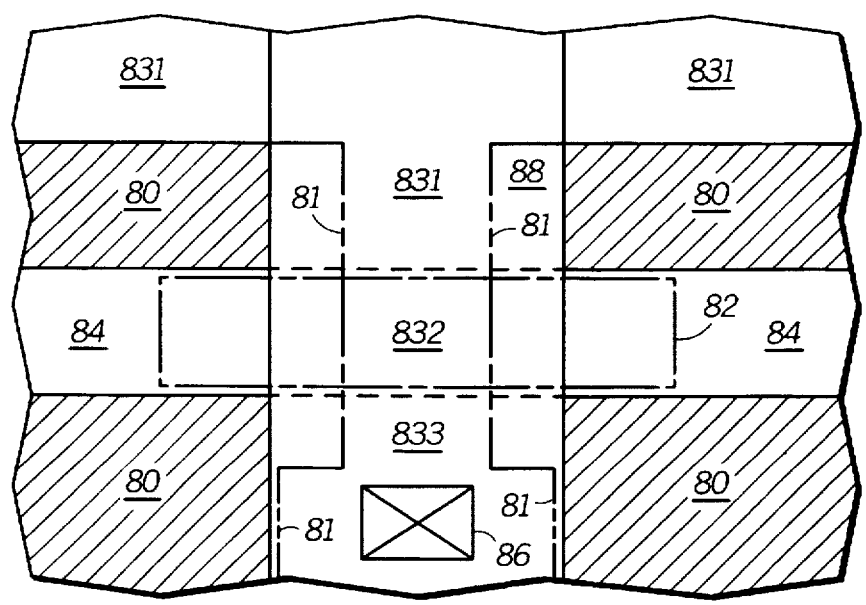
FIG. 8 includes a plan view of a portion of an integrated circuit.

FIG. 8 includes an illustration of a plan view of a portion of the integrated circuit including the EPROM cell as formed using the masks illustrated in FIGS. 3–7 (step 18 of FIG. 1). FIG. 8 includes field isolation regions 80 and an active region 81 that includes source region 831, a channel region 832, and a drain region 833. The edges of the active region underlying interconnect 88 are illustrated with a line-dash-dash-line designation. The source region 831 is a portion of the active region 81 that lies adjacent to the word line and lies near the top of FIG. 8. The drain region 833 is a portion of the active region 81 that lies near the bottom of FIG. 8. The channel region 832 is defined by the source and drain regions 831 and 833 and underlies a floating gate member 82.

The floating gate member 82 overlies the channel region 832 and portions of the field isolation regions 80 and underlies the control gate member 84. The edges of the floating gate member 82 are illustrated by a line-dash-line designation. The control gate member 84 overlies the floating gate member 82 and portions of the field isolation regions 80. The portion of the control gate member 84 that underlies the interconnect 88 is illustrated with a dashed line. A contact 86 is shown by a ☒ in FIG. 8. The contact 86 can be a contact plug or a location when the interconnect 88 contacts the drain region 833. In either case, the contact 86 is a location where electrical contact is made between the interconnect 88 and the underlying drain region 833.

Figure 9:
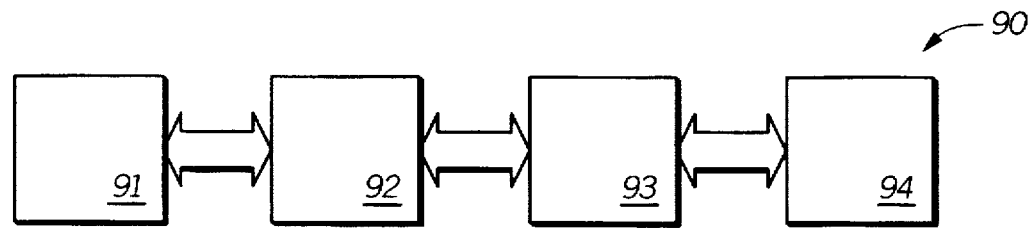
FIG. 9 includes a plurality of integrated circuits coupled to one another.

The method of the present invention is not limited to just an integrated circuit. The method can be used to simulate a module or modules within the integrated circuit 20 including the central processing unit 22 or the memory 24. The method can also be used for a plurality of integrated circuits 90, such as the integrated circuits 91–94 in FIG. 9. Each of the integrated circuits 91–94 are bi-directionally coupled to at least one other integrated circuit. The integrated circuits 91–94 can include microcontrollers, microprocessors, digital signal processors, memories, or the like.

The present invention has benefits over conventional methods. A machine is used to link the object code with the stimulus file. Both the object code and stimulus file are generated from the input file. The linking between the object code and stimulus file is synchronized because the linking portions of the source code and stimulus sections are related to a specific instruction in the source code. Alternatively, the linking could be related to a plurality of specific instructions in the source code. A person does not need to perform the linking or use a listing file to confirm that synchronization.

The methods of the present invention are more flexible in that the input file can be more readily be modified and still not affect the synchronization between the object code and stimulus file. Many types of modifications can be made to the input file that do not affect the synchronization. After modifying the input file, it is processed by a machine to generate new object code and a new stimulus file that are also synchronized. Modifications to an input file can be made without having to determine whether the modification justifies the time needed to manually re-synchronize object code and a stimulus file.

The methods of the present invention are less error prone and labor intensive because there is no manual synchronization. This allows a product to go from design to working silicon faster, thereby reducing cycle time. Getting new products to market faster generally results in higher profit margins for those products.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A method of simulating an electronic circuit design that represents an electronic circuit, the method comprising the steps of:

generating an input file having an instruction section and a stimulus section, wherein:
the instruction section is capable of testing the electronic circuit design;
the stimulus section includes a stimulus;
the stimulus represents a signal input to the electronic circuit in order to monitor a response of the electrical circuit;
the instruction section has a first instruction that is a linking instruction to indicate an occurrence of a second instruction;
the stimulus section has a first stimulus section linking portion, wherein:
the first stimulus section linking portion is capable of providing the stimulus in response to an execution of the first instruction; and
an execution of the second instruction is capable of being altered in response to the stimulus; and
the first instruction and the first stimulus section linking portion form a first linking pair and are related to the second instruction; and processing the input file using a machine to generate object code and a stimulus file, wherein the stimulus file has a first stimulus file linking portion that corresponds to the first stimulus section linking portion.

2. The method of claim 1, wherein the step of generating the input file is performed such that the first instruction and the first stimulus section linking portions are related to a characteristic selected from a group consisting of a program counter, a label, and an expression.

3. The method of claim 1, further comprising a step of modifying the input file between the steps of generating the input file and processing the input file, wherein the input file includes a modification to the input file before the first linking pair.

4. The method of claim 1, wherein the step of processing the input file is performed on the machine that is selected from a group of a computer or a data processor.

5. The method of claim 1, further comprising steps of:
generating a model file that represents the electronic circuit design; and
running a simulation program using the object code, the stimulus file, and the model file.

6. The method of claim 1, wherein the electronic circuit design is an integrated circuit selected from a group consisting of a microcontroller, a microprocessor, and a digital signal processor.

7. The method of claim 1, wherein the step of generating the input file is performed such that the stimulus and the execution of the second instruction are synchronized.

8. A method of simulating an electronic circuit design that represents an electronic circuit, the method comprising the steps of:

generating an input file having an instruction section and a stimulus section, wherein:
the instruction section is capable of testing the electronic circuit design;
the stimulus section includes a first stimulus, wherein the first stimulus represents a first signal input to the electronic circuit in order to monitor a first response of the electronic circuit;
the stimulus section includes a second stimulus, wherein the second stimulus represents a second signal input to the electronic circuit in order to monitor a second response of the electronic circuit;
the instruction section has a first instruction that is a linking instruction to indicate an occurrence of a second instruction and a third instruction that is a linking instruction to indicate an occurrence of a fourth instruction;
the stimulus section has a first stimulus section linking portion, wherein:
the first stimulus section linking portion is capable of providing the first stimulus in response to an execution of the first instruction; and
an execution of the second instruction is capable of being altered in response to the first stimulus;
the stimulus section has a second stimulus section linking portion wherein:
the second stimulus section linking portion is capable of providing the second stimulus in response to an execution of the third instruction; and
an execution of the fourth instruction is capable of being altered in response to the second stimulus;
the first instruction and the first stimulus section linking portion form a first linking pair and are related to the second instruction; and
the third instruction and the second stimulus section linking portion form a second linking pair and are related to the fourth instruction; and modifying the input file before the second linking pair.

9. The method of claim 8, wherein the step of modifying modifies the input file before the second linking pair and after the first linking pair.

10. The method of claim 8, wherein the step of generating the input file is performed such that:
the first instruction and the first stimulus linking portion are related to a first characteristic selected from a group consisting of a program counter, a label, and an expression land the third instruction and the second stimulus section linking portion are related to a second characteristic selected from a group consisting of a program counter, a label, and an expression.

11. The method of claim 8, wherein the step of modifying modifies the instruction section.

12. The method of claim 8, further comprising steps of:
processing the input file using a machine to generate object code and a stimulus file, wherein:
the stimulus file has a first stimulus file linking portion and a second stimulus file linking portion; the first stimulus file linking portion corresponds to the first stimulus section linking portion; and
the second stimulus file linking portion corresponds to the second stimulus section linking portion; and
generating a model file that represents the electronic circuit design; and
running a simulation program using the object code, the stimulus file, and the model file.

13. The method of claim 12, wherein the step of processing the input file is performed such that the machine is selected from a group of an assembler or compiler.

14. The method of claim 8, wherein the electronic circuit design is an integrated circuit selected from a group consisting of a microcontroller, a microprocessor, and a digital signal processor.

15. A method of forming an integrated circuit comprising the steps of:

simulating an electronic circuit design that represents an electronic circuit including steps of:
generating an input file having an instruction section and a stimulus section, wherein:
the instruction section is capable of testing the electronic circuit design;
the stimulus section includes a first stimulus;
the first stimulus represents a first signal input to the electronic circuit in order to monitor a first response of the electronic circuit;
the instruction section has a first instruction that is a linking instruction to indicate an occurrence of a second instruction;
the stimulus section has a first stimulus section linking portion, wherein:
the first stimulus section linking portion is capable of providing a first stimulus in response to an execution of the first instruction; and
an execution of the second instruction is capable of being altered in response to the first stimulus; and
the first instruction and the first stimulus section linking portion form a first linking pair and are related to the second instruction; and
processing the input file using a machine to generate object code and a stimulus file, wherein:
the stimulus file has a first stimulus file linking portion; and
the first stimulus file linking portion corresponds to the first stimulus section linking portion; and
generating data corresponding to the electronic circuit design after the step of simulating, wherein the data can be used to generate a plurality of masks.

16. The method of claim 15, further comprising the step of generating a plurality of masks using the data corresponding to the plurality of masks.

17. The method of claim 15, wherein the step of generating the input file is performed such that the first instruction and the first stimulus section linking portion are related to a first characteristic selected from a group consisting of a program counter, a label, and an expression.

18. The method of claim 15, further comprising a step of modifying the input file between the steps of generating the input file and processing the input file, wherein the input file includes a modification to the input file before the first linking pair.

19. The method of claim 18, wherein:
the step of generating the input file is performed such that:

the stimulus section further includes a second stimulus;
the second stimulus represents a second signal input to the electronic circuit in order to monitor a second response of the electronic circuit;
the instruction section has a third instruction that is a linking instruction to indicate the occurrence of a fourth instruction;
the stimulus section has a second stimulus section linking portion, wherein:
the second stimulus section is capable of providing the second stimulus in response to an execution of the third instruction; and
an execution of the fourth instruction is capable of being altered in response to the second stimulus, and
the third instruction and the second stimulus section linking portion form a second linking pair and are related to the fourth instruction; and
the step of modifying the input file includes a modification to the input file before the second linking pair.

20. The method of claim 18, wherein the step of modifying modifies the instruction section.

21. The method of claim 15, wherein the step of processing the input file is performed on the machine that is selected from a group of a computer or a data processor.

22. The method of claim 15, wherein the step of simulating further comprising steps of:
generating a model file that represents the electronic circuit design; and
running a simulation program using the object code, the stimulus file, and the model file.

23. The method of claim 15, wherein the step of processing the substrate is performed such that the integrated circuit is selected from a group consisting of a microcontroller, a microprocessor, and a digital signal processor.

24. The method of claim 15, further comprising the step of processing a substrate using the plurality of masks to form the integrated circuit.

25. The method of claim 15, wherein the step of generating data is performed using magnetic tapes for storing the data.

26. The method of claim 15, wherein the step of simulating further comprises the steps of:
modifying the input file, wherein the input file includes a modification to the input file before the first linking pair;
generating a model file that represents the electronic circuit; and
running a simulation program using the object code, the stimulus file, and the model file.

27. A method of simulating an electronic circuit design that represents an electronic circuit, the method comprising the steps of:
generating an input file having instructions and stimuli, wherein:
the instructions are capable of testing the electronic circuit design;
the instructions include linking portions of linking instructions and non-linking portions of non-linking instructions, and each of the instructions is selected from a group consisting of linking instructions and non-linking instructions;
each of the linking portions of linking instructions indicates an occurrence of at least one of the non-linking portions of corresponding non-linking instruction;
each of the stimuli:
represents a signal input to the electronic circuit in order to monitor a response of the electronic circuit; and
has a corresponding stimulus section linking portion;
within the input file, each linking portion has only one corresponding non-linking, portion, and only one corresponding stimulus section linking portion, wherein a combination of these portions forms a linking set, and
the input file has a first linking set and a last linking set is located in the input file after the first linking set;
each of the corresponding stimulus section linking portions is capable of providing its corresponding stimulus in response to an execution of the linking instruction within a same linking set;
an execution of the corresponding non-linking instruction within the same linking set is capable of being altered in response to one of the stimuli, wherein the one of the stimuli corresponds to the corresponding stimulus section linking portion within the same linking set as the corresponding non-linking instruction; and :
modifying the input file, wherein the input file includes a modification to the input file before the last linking set.

28. The method of claim 27, wherein the step of generating the input file is performed such that each linking set is related to a characteristic selected from a group consisting of a program counter, a label, and an expression.

29. The method of claim 27, further comprising steps of:
processing the input file using a machine to generate object code and a stimulus file, wherein:
the stimulus file includes stimulus file linking portions; and
each stimulus file linking portion has one associated corresponding stimulus section linking portion;
generating a model file that represents the electronic circuit design; and
running a simulation program using the object code, the stimulus file, and the model file.

* * * * *